(12) United States Patent
Liaw et al.

(10) Patent No.: US 7,705,464 B2
(45) Date of Patent: Apr. 27, 2010

(54) CONNECTION STRUCTURE FOR SEMICONDUCTOR DEVICES

(75) Inventors: Jhon Jhy Liaw, Hsin-Chu (TW); Sung-Chun Hsieh, Taipei (TW); Wesley Lin, Hsin-Chu (TW); Chii-Ming W Wu, Hsinchu (TW); Ren-Fen Tsui, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 823 days.

(21) Appl. No.: 10/939,931

(22) Filed: Sep. 13, 2004

(65) Prior Publication Data

US 2006/0055043 A1    Mar. 16, 2006

(51) Int. Cl.
*H01L 23/48*     (2006.01)
*H01L 23/52*     (2006.01)
*H01L 29/40*     (2006.01)

(52) U.S. Cl. .................. 257/774; 257/773; 257/775; 257/E31.038; 257/E21.577; 257/E21.585; 257/776; 438/637; 438/638; 438/639; 438/675

(58) Field of Classification Search ............... 257/750, 257/762, 773–776, E31.038, E21.577, E21.585
See application file for complete search history.

(56) References Cited

U.S. PATENT DOCUMENTS

| | | | | |
|---|---|---|---|---|
| 5,304,743 A | * | 4/1994 | Sen et al. | 174/262 |
| 5,457,879 A | * | 10/1995 | Gurtler et al. | 438/108 |
| 6,046,100 A | * | 4/2000 | Ramaswami et al. | 438/624 |
| 6,072,242 A | * | 6/2000 | Son | 257/774 |
| 6,121,684 A | | 9/2000 | Liaw | |
| 6,222,722 B1 | * | 4/2001 | Fukuzumi et al. | 361/305 |
| 6,287,949 B1 | * | 9/2001 | Mori et al. | 438/612 |
| 6,479,902 B1 | * | 11/2002 | Lopatin et al. | 257/774 |
| 6,501,165 B1 | * | 12/2002 | Farnworth et al. | 257/686 |
| 6,831,367 B2 | * | 12/2004 | Sekine | 257/774 |
| 7,057,292 B1 | * | 6/2006 | Elenius et al. | 257/779 |
| 2004/0061238 A1 | | 4/2004 | Sekine | |
| 2004/0256726 A1 | * | 12/2004 | Harada et al. | 257/758 |
| 2005/0023606 A1 | * | 2/2005 | Williams et al. | 257/328 |
| 2005/0093176 A1 | * | 5/2005 | Hung et al. | 257/786 |
| 2005/0196959 A1 | * | 9/2005 | Ueno | 438/643 |
| 2005/0202645 A1 | * | 9/2005 | Kim et al. | 438/386 |

OTHER PUBLICATIONS

Singapore Patent Office, Written Opinion—Invitation to Respond to Written Opinion, Apr. 21, 2008, 7 pages, Application No. 200500719-0 (Filed Feb. 4, 2005), Australia.

* cited by examiner

*Primary Examiner*—Jasmine J Clark
(74) *Attorney, Agent, or Firm*—Haynes and Boone, LLP (57) ABSTRACT

The present disclosure relates generally to the manufacturing of semiconductor devices, and more particularly to an improved connection structure for semiconductor devices. A connection structure for a semiconductor device includes: a peanut-shaped opening comprising a narrow area and one or more wide areas, wherein the narrow area is between two of the one or more wide areas; and a conductive plug for filling at least partially the peanut-shaped opening.

34 Claims, 6 Drawing Sheets

CONNECTION STRUCTURE FOR SEMICONDUCTOR DEVICES

BACKGROUND

The semiconductor integrated circuit (IC) industry has experienced rapid growth. Technological advances in IC materials and design have produced generations of ICs where each generation has smaller feature sizes and more complex circuits than those from the previous generation. Among the feature sizes which are reduced in size are the width and spacing of interconnecting metal lines and the contact openings through which the metallization makes electrical contact to device regions.

One solution for some of these problems is provided in U.S. Pat. No. 6,121,684, incorporated herein by reference. This patent provides an integrated butt contact having a protective spacer. Butted contacts, such as those discussed in the presently incorporated patent, have been adopted in semiconductor memory devices to increase device density by reducing the necessary size of the area for contact purposes. However, since butted contacts are frequently used in combination with square contacts, such a combination causes challenges to lithograph and etch steps. For example, lithograph and etch steps have to accommodate different contact sizes, shapes and loading effects, resulting in frequent defects, such as photo bridge, contact hole blind and/or high junction leakage.

Accordingly, it is desirable to provide an improved connection structure for semiconductor devices.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

The present disclosure relates generally to the manufacturing of semiconductor devices, and more particularly to an improved connection structure for semiconductor devices.

It is to be understood that the following disclosure provides many different embodiments, or examples, for implementing different features of the disclosure. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact.

Figure 1:
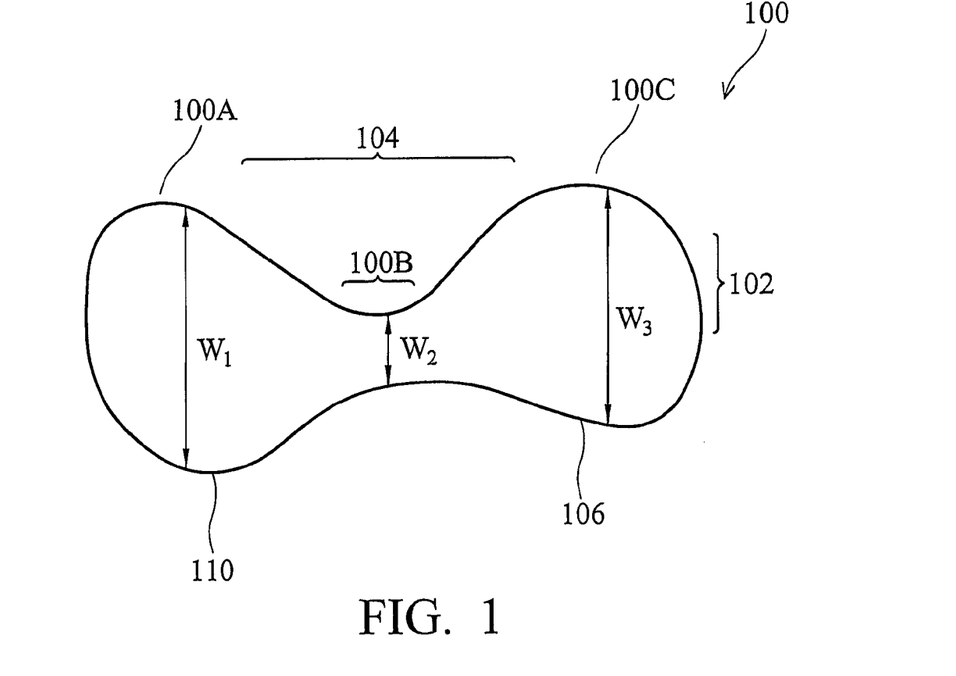
FIG. 1 illustrates an exemplary top view of a connection structure.

Referring now to FIG. 1, shown therein is an exemplary top view of a connection structure 100. In this embodiment, the connection structure 100 may include a peanut-shaped opening 106 and a conductive plug 110. The opening 106 may include a long side 104 and a short side 102. Further, the opening 106 may include a narrow area 100B and wide areas 100A and 100C. A width w2 of the narrow area 100B may be sandwiched between and smaller than a width w1 and/or a width w3 associated with the wide areas 100A and 100C, respectively. Here, the width w2 may be between about one sixth to about four fifths of the width w1. Similarly, the width w2 may be between about one sixth to about four fifths of the width w3. However, it is also contemplated that the width w2 may be larger than the parameters specified above relative to each of the widths w1 and w3, and that w2 may be larger than the width w1 and/or the width w3.

The opening 106 may at least partially be filled with the conductive plug 110, which may include refractory metal, $TiSi_2$, $CoSi_2$, NiSi, PtSi, W, $WSi_2$, metal silicide, TiN, TiW, TaN, Al, AlCu, Cu, Cu content, and/or any other suitable materials. As described in connections with FIG. 4 below, the connection structure 100 may also include one or more diffusion barrier layers (not shown) lining at least partially the opening 106.

In one example, the size of the connection structure 100 may be less than approximately 0.05 $um^2$. However, it is contemplated that the size of the connection structure 100 may be larger than 0.05 $um^2$. It is also contemplated that the opening 106 may comprise other regular or irregular shapes.

Figure 1A:
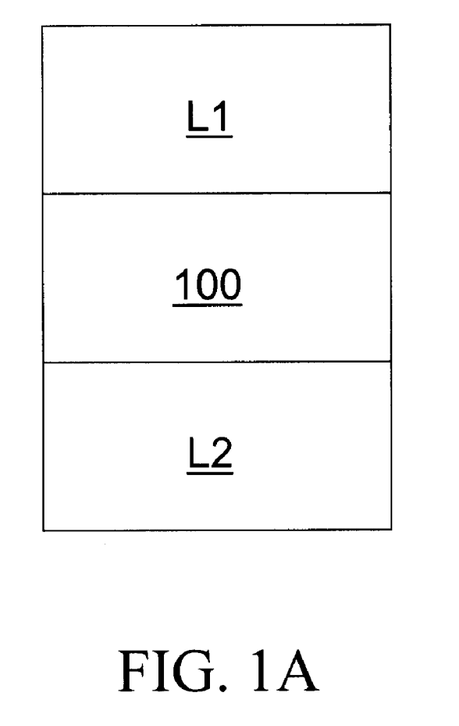

The connection structure 100 may be used in a variety of semiconductor devices, such as memory devices (including but not limited to a static random access memory (SRAM)), logic devices (including but not limited to a metal-oxide semiconductor field-effect transistor (MOSFET)), and/or other devices. For a single semiconductor device, as shown in FIG. 1A, the connection structure 100 may be utilized for connecting a first layer L1 and a second layer L2 such as interconnect layers, an interconnect layer and a substrate, an interconnect layer and a gate, an active region and a gate, an active region and an interconnect layer, or serve other connection purposes. It is also contemplated that the connection structure 100 may be utilized to connect different semiconductor devices, such as a drain region of a first device and the gate of a second device, or a source region of a first device and the gate of a second device. It is contemplated that the interconnect layer or the gate may include polysilicon with N type dopant, polysilicon with P-type dopant, polysilicon with N-type dopant and P type dopant, metal, refractory metal, $TiSi_2$, $CoSi_2$, NiSi, PtSi, W, $WSi_2$, metal silicide, TiN, TiW, TaN, and/or other materials.

Figure 2:
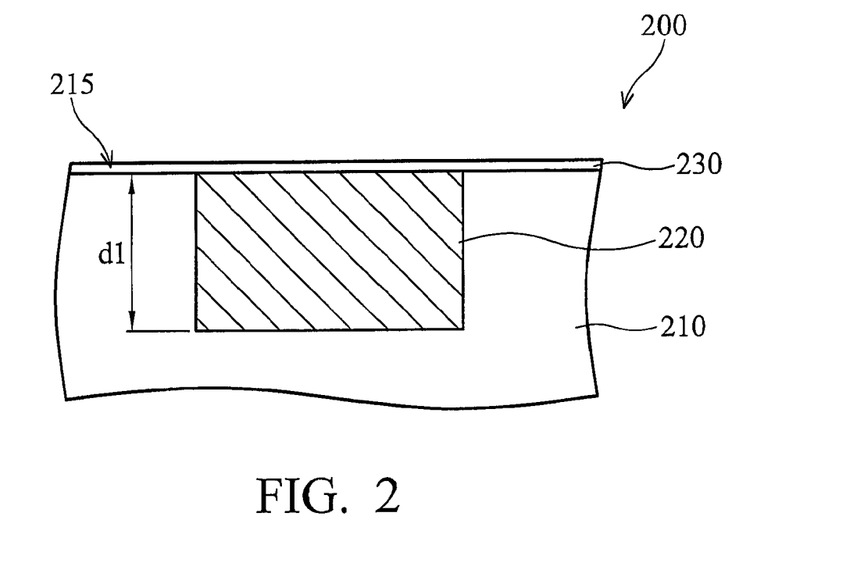
FIGS. 2–5 illustrate exemplary cross-sectional views of partial semiconductor devices.

A simplified exemplary process for forming a semiconductor device utilizing the connection structure 100 is now further described. Referring now to FIG. 2, shown therein is an exemplary partial semiconductor device 200. In this embodiment, the semiconductor device 200 may commence with a substrate 210. The substrate 210 may include an elementary semiconductor, such as crystal silicon, polycrystalline silicon, amorphous silicon, and/or germanium; a compound semiconductor, such as silicon carbide and/or gallium arsenic; an alloy semiconductor, such as SiGe, GaAsP, AlInAs, AlGaAs, and/or GaInP. Further, the substrate 210 may include a bulk semiconductor, such as bulk silicon, and such a bulk semiconductor may include an epi silicon layer. It may also or alternatively include a semiconductor-on-insulator substrate, such as a silicon-on-insulator (SOI) substrate, or a thin-film transistor (TFT) substrate. The substrate 210 may also or alternatively include a multiple silicon structure or a multilayer compound semiconductor structure.

A conductive layer 220 may be deposited in a recess formed in the substrate 210 by chemical vapor deposition (CVD), plasma-enhanced CVD (PECVD), physical vapor deposition (PVD), ionized PVD (I-PVD), atomic layer deposition (ALD), plating, and/or other processes. Chemical-mechanical planarization and/or chemical-mechanical polishing (collectively referred to herein as CMP) may also be employed during the formation of the conductive layer 220. For example, CMP may be employed to planarize the conductive layer 220, so that it becomes substantially coplanar with a surface 215 of the substrate 210, as shown in FIG. 2. In another embodiment, planarization of the conductive layer 220 may be less extensive, so that the conductive layer 220 may at least partially extend from the substrate 210 to above the surface 215. Characterizations herein of the conductive layer 220 as being formed in the substrate 210 is intended to capture both of those embodiments, in addition to other alternative embodiments.

The conductive layer 220 may be a conductive feature connecting semiconductor devices, integrated circuit devices, integrated circuit components, and/or interconnects therein. A depth d1 of the conductive layer 220 may range between about 1500 Å and about 5000 Å. For example, in one embodiment, the depth d1 may be about 3500 Å. The conductive layer 220 may include aluminum, aluminum alloy, copper, copper alloy, tungsten, and/or other conductive materials.

The semiconductor device 200 may further include a dielectric layer 230 overlying the semiconductor substrate 210 and the conductive layer 220. The dielectric layer 230 may be an etch stop layer and/or a diffusion barrier layer, and may include one or more individual layers. The dielectric layer 230 may include silicon nitride, other dielectric materials, and/or etch stop materials.

Figure 3:
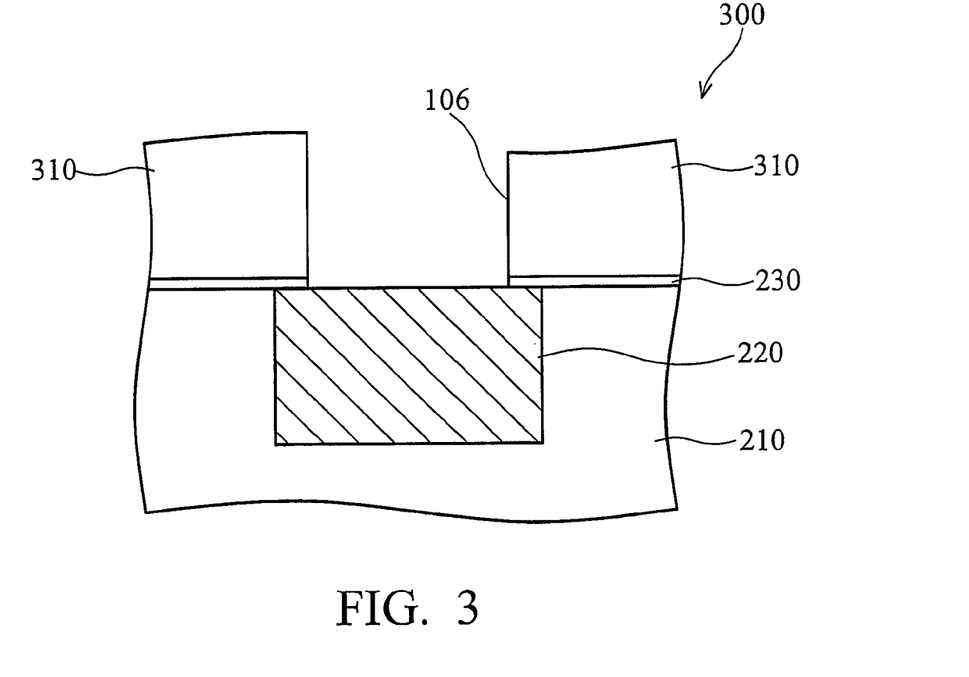

Referring now to FIG. 3, shown therein is a further developed exemplary partial semiconductor device 300. In this embodiment, a dielectric layer 310 may be deposited on the surface of the substrate 210 or the dielectric layer 230. The dielectric layer 310 may be formed by CVD, PECVD, ALD, PVD, spin-on coating and/or other processes. The dielectric layer 310 may be an inter-metal dielectric (IMD), and may include silicon dioxide, polyimide, spin-on-glass (SOG), fluoride-doped silicate glass (FSG), Black Diamond® (a product of Applied Materials of Santa Clara, Calif.), Xerogel, Aerogel, amorphous fluorinated carbon, and/or other materials. In one embodiment, the dielectric layer 310 may include a low-k material having a dielectric constant k of less than about 3.3. For example, the dielectric layer 310 may include an organic low-k material, CVD low-k material, and/or other suitable materials.

The dielectric layer 310 may be patterned by photolithography, etching, and/or other means to form the opening 106 of FIG. 1, thereby exposing a portion of the underlying dielectric layer 230 or conductive layer 220. The opening 106 may be a via hole or a dual damascene opening (e.g., an opening comprising a via hole and a conductive line trench).

If necessary or desired, the exposed portion of the dielectric layer 230 proximate the opening 106 may also be removed by dry etching and/or other processes to expose a portion of the underlying conductive layer 220. Removal of the dielectric layer 230 may employ a process utilizing CH4 as a primary gas, possibly mixed with $O_2$ and $N_2$ to adjust the etching rate and selectivity.

Figure 4:
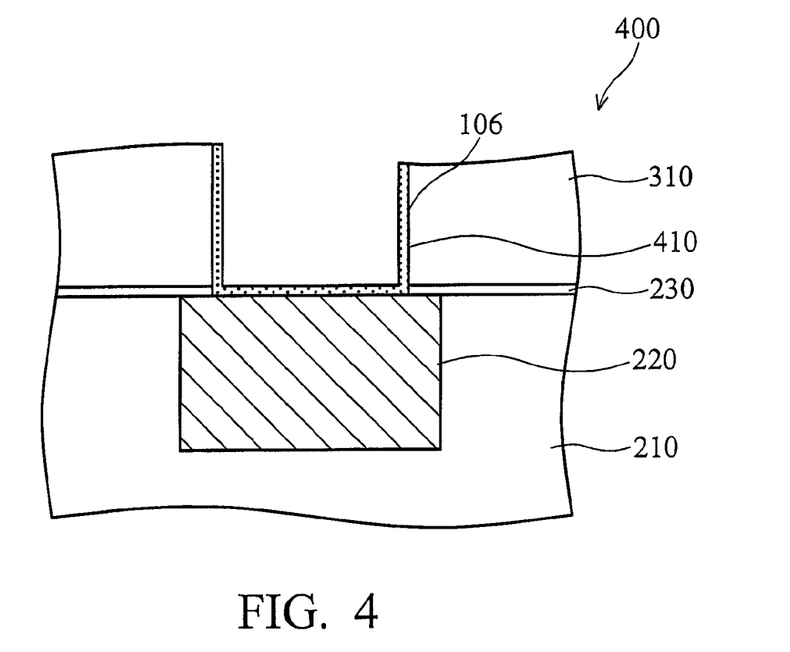

Referring now to FIG. 4, shown therein is a further developed exemplary partial semiconductor device 400. In this embodiment, a diffusion barrier layer 410 may be deposited by self-ionized plasma (SIP) PVD and/or ionized metal plasma (IMP) PVD, wherein the diffusion barrier layer 410 may at least partially line the opening 106. The diffusion barrier layer 410 may include Ta, TaN, Ti, TiN, and/or other barrier materials.

In one embodiment, the diffusion barrier layer 410 may be formed prior to removing a portion of the dielectric layer 230. In such an embodiment, a bottom portion of the diffusion barrier layer 410 and a portion of the dielectric layer 230 may be sequentially removed by dry etching and/or sputtering.

In furtherance of the example, the bottom portion of the diffusion barrier layer 410 proximate the conductive layer 220, whether formed prior to or after removing a portion of the dielectric layer 230, may be removed by in-situ sputtering utilizing SIP or IMP. Consequently, at least a portion of the conductive layer 220 may be exposed.

In furtherance of the example, a second diffusion barrier layer (not shown) may be optionally deposited over the diffusion barrier layer 410. The second diffusion barrier layer may be formed in-situ by an IMP or SIP system, and may be substantially similar to the diffusion barrier layer 410 described above. For example, the second diffusion barrier layer may include Ta, TaN, Ti, TiN, and/or other barrier materials.

Figure 5:
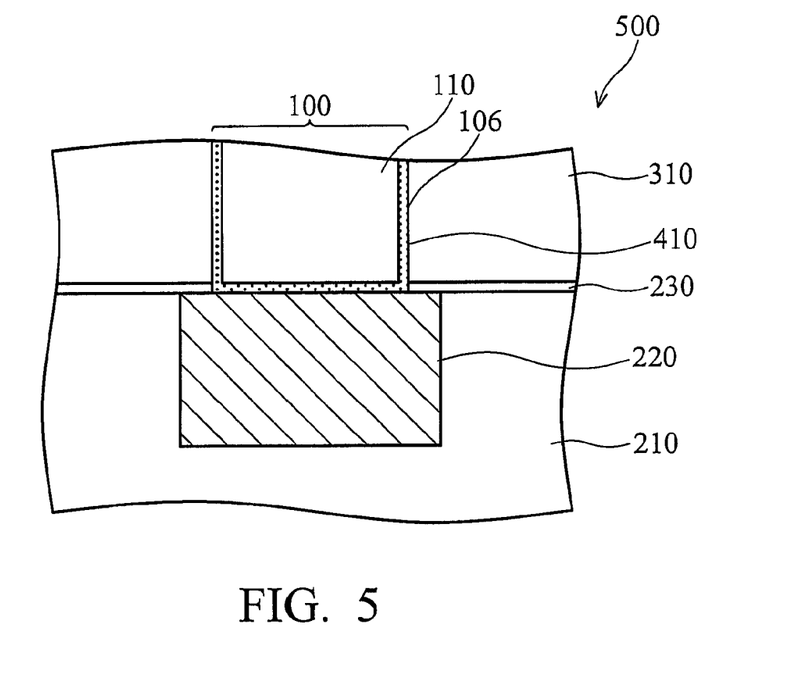

Referring now to FIG. 5, shown therein is a further developed exemplary partial semiconductor device 500. In this embodiment, the opening 106 may at least partially be filled with the conductive plug 110 of FIG. 1 by damascene processing or other methods to form the connection structure of FIG. 1. In one embodiment, one or more seed layers comprising copper, copper alloys, and/or other seed materials may be deposited on the diffusion barrier layer 410, thereby lining the opening 106 by PVD, IMP, SIP, and/or other processes. The opening 106 may then be filled with the conductive plug 110 that may include materials substantially similar to that of the conductive layer 220. In one example, the conductive plug 110 may include refractory metal, $TiSi_2$, $CoSi_2$, NiSi, PtSi, W, $WSi_2$, metal silicide, TiN, iW, TaN, Al, AlCu, Cu, Cu content, aluminum, aluminum alloy, copper, copper alloy, tungsten, and/or other suitable materials. The conductive material employed to form the conductive plug 110 may be formed in the opening 106 by electroplating and/or other deposition processes. Excessive conductive material formed over the dielectric layer 310 may then be removed by CMP and/or other methods.

Figure 6:
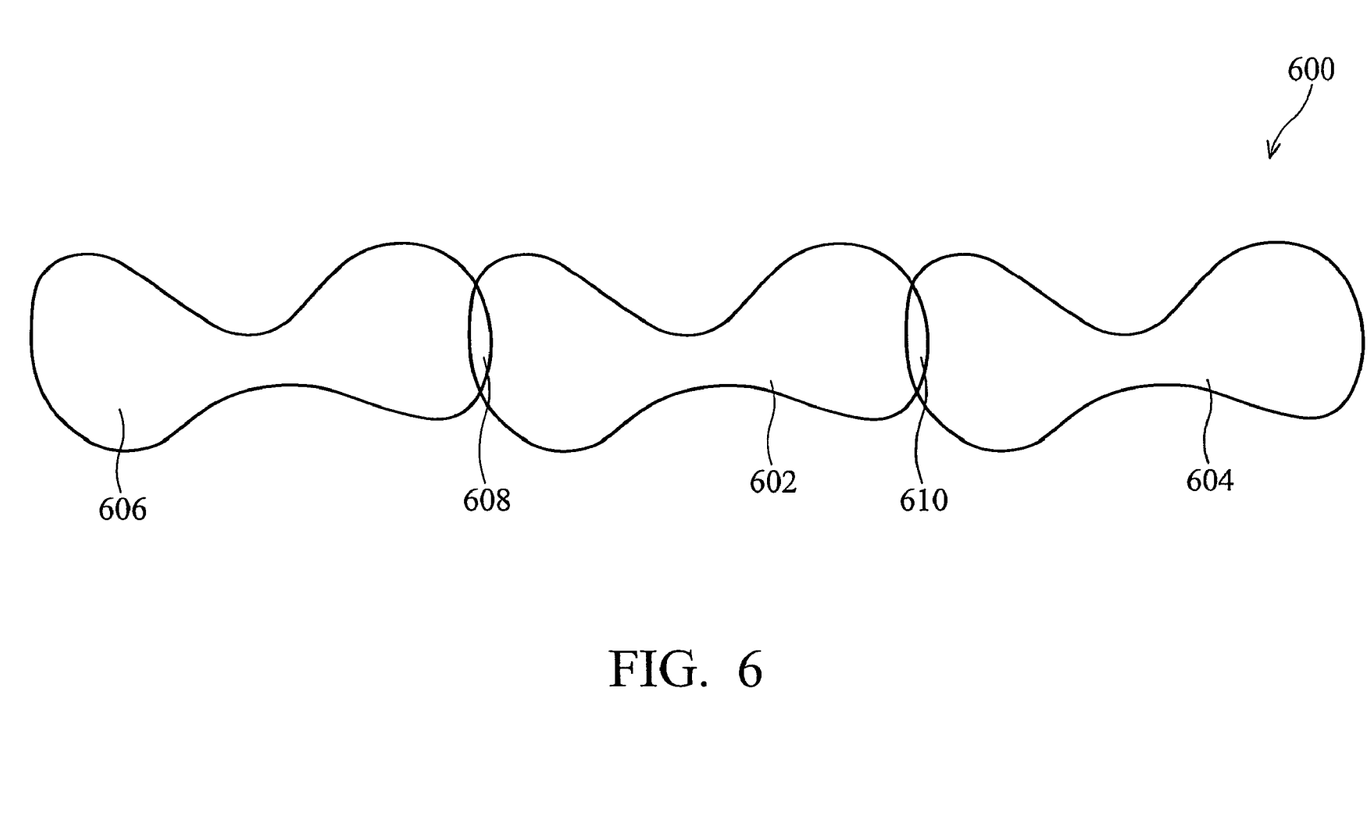
FIG. 6 illustrates an exemplary top view of a hole chain structure.

Referring now to FIG. 6, shown therein is an exemplary hole chain structure 600. In this embodiment, connection structures 602, 604 and 606, each of which is substantially similar or identical to the connection structure 100, may together form the hole chain structure 600. Even though in this illustration, the shapes and sizes of the connection structures 602, 604 and 606 are substantially similar or identical, it is contemplated that at least two of the connection structures 602, 604 and 606 may differ in shapes and sizes. In one example, the size of an overlapped area 608 may be less than about eighty percent of the size of the connection structure 602 and/or the connection structure 606. Likewise, the size of an overlapped area 610 may be less than eighty percent of the size of the connection structure 602 and/or the connection structure 604. In addition, it is also contemplated that a fewer or a greater number of connection structures may be utilized to form the hole chain structure 600.

Figure 7:
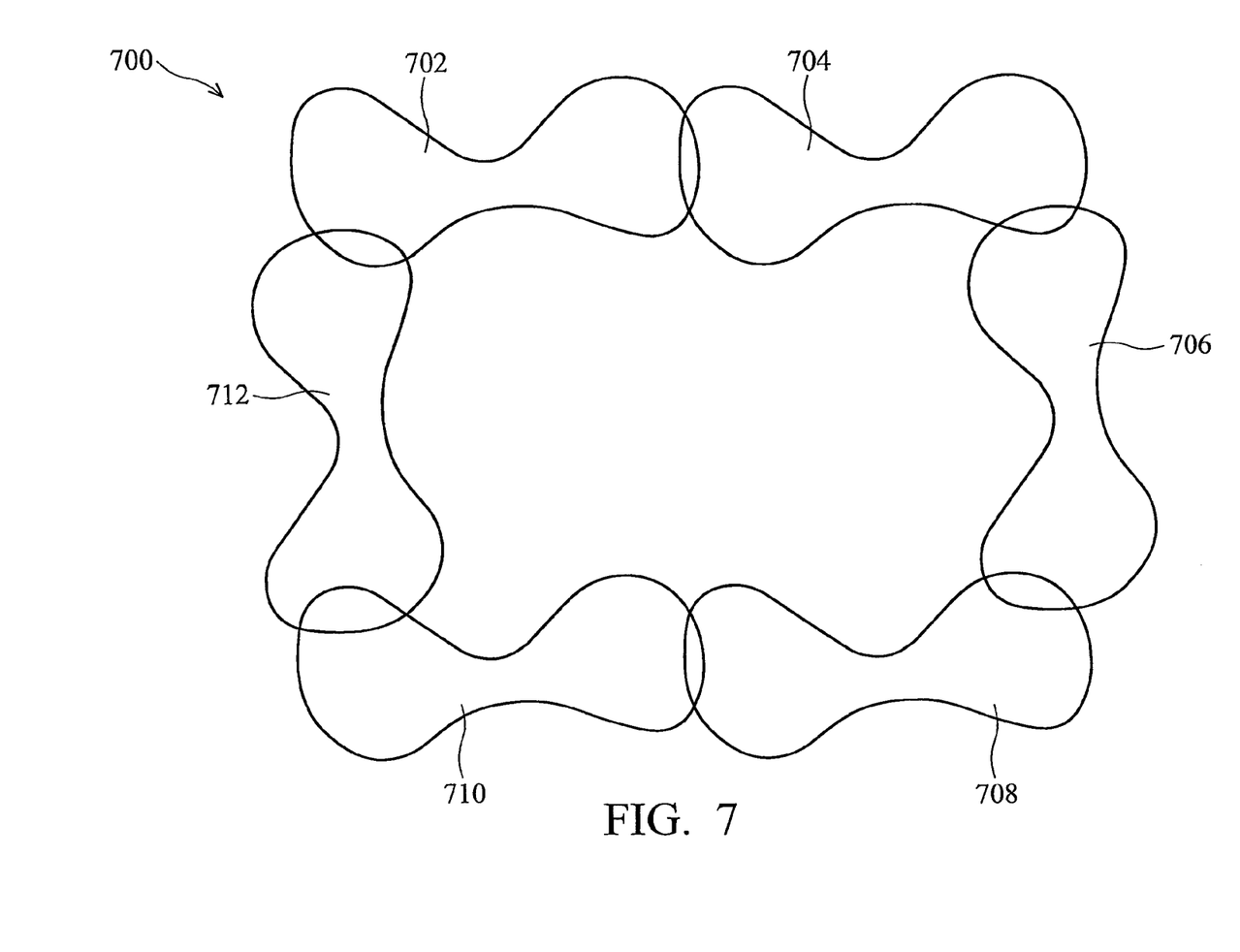
FIG. 7 illustrates an exemplary top view of a hole array structure.

Referring now to FIG. 7, shown therein is an exemplary hole array structure. In this embodiment, connection structures 702, 704, 706, 708, 710 and 712, each of which is substantially similar or identical to the connection structure 100, may together form the hole array structure 700. Even though in this example, the shapes and sizes of the connection structures 702, 704, 706, 708, 710 and 712 are substantially similar or identical, it is also contemplated that at least two of the connection structures 702, 704, 706, 708, 710 and 712 may differ in shapes and sizes. In addition, it is also contemplated that a fewer or a greater number of connection structures may be utilized to form the hole array structure 700 or other connection types. Therefore, a variety of variations are contemplated by the present disclosure.

Although only a few exemplary embodiments of this disclosure have been described in details above, those skilled in the art will readily appreciate that many modifications are possible in the exemplary embodiments without materially departing from the novel teachings and advantages of this disclosure. Also, features illustrated and discussed above with respect to some embodiments can be combined with features illustrated and discussed above with respect to other embodiments. Accordingly, all such modifications are intended to be included within the scope of this disclosure.

What is claimed is:

1. A semiconductor device, comprising:
   a first layer;
   a second layer, the first layer overlying the second layer; and
   a connection layer disposed between the first and second layers, the connection layer on and in contact with the first and second layers, wherein the connection layer includes:
      an opening comprising a narrow area between two wide areas; and
      a conductive plug for filling at least partially the opening, the conductive plug having an upper surface bounded by the narrow and two wide areas that contacts the first layer and an opposing lower surface bounded by the narrow and two wide areas that contacts the second layer;
   wherein a length of the opening in the direction parallel to the first layer extends through the narrow area and two wide areas of the opening.

2. The semiconductor device of claim 1 wherein the width of the narrow area is at least about one sixth of the width of at least one of the two wide areas.

3. The semiconductor device of claim 1 wherein the width of the narrow area is no greater than about four fifths of the width of at least one of the two wide areas.

4. The semiconductor device of claim 1 wherein the width of the narrow area ranges between about one sixth to about four fifths of the width of at least one of the two wide areas.

5. The semiconductor device of claim 1 wherein the size of the opening is less than about 0.05 um2.

6. The semiconductor device of claim 1 wherein the first layer includes a substrate.

7. The semiconductor device of claim 6 wherein the second layer comprises a material selected from the following group: polysilicon with N-type dopant, polysilicon with P-type dopant, polysilicon with N-type dopant and P-type dopant, metal, refractory metal, $TiSi_2$, $CoSi_2$, NiSi, PtSi, W, $WSi_2$, metal silicide, TiN, TiW, and TaN.

8. The semiconductor device of claim 1 wherein the first and second layers include interconnect layers.

9. The semiconductor device of claim 1 wherein the the first layer includes an interconnect layer and the second layer includes a substrate.

10. The semiconductor device of claim 1 wherein the first layer includes an interconnect layer and the second layer includes an active region.

11. The semiconductor device of claim 1 wherein the first layer includes an active region and the second layer includes a gate.

12. The semiconductor device of claim 1 wherein the connection layer is for high current connection path between two metal layers.

13. The semiconductor device of claim 1 wherein the first layer includes a drain region of a first device and the second layer includes a gate of a second device.

14. The semiconductor device of claim 1 wherein the conductive plug comprises a material selected from the following group: refractory metal, $TiSi_2$, $CoSi_2$, NiSi, PtSi, W, $WSi_2$, metal silicide, TiN, TiW, TaN, Al, AlCu, Cu, and Cu content.

15. A semiconductor device, comprising:
   a first layer;
   a connection layer on and in contact with the first layer, wherein the connection layer comprises one or more peanut-shaped connection structures; and
   a second layer on and in contact with the connection layer, wherein at least two of the one or more peanut-shaped connection structures are adjacent to each other; wherein the peanut-shaped connection structure includes a narrow area and two wide areas, wherein a length of the peanut-shaped connection structure in the direction an parallel to the first layer extends through the narrow area and two wide areas.

16. The semiconductor device of claim 15 wherein the first layer is a gate.

17. The semiconductor device of claim 15 wherein the first layer is an interconnect layer.

18. The semiconductor device of claim 15 wherein the first layer is a substrate.

19. The semiconductor device of claim 15 wherein at least two of the one or more peanut-shaped connection structures are overlapped, wherein the size of the overlapped area is less than about 80% of the size of the at least two peanut-shaped connection structures.

20. The semiconductor device of claim 15 wherein the one or more peanut-shaped connection structures form a hole chain structure.

21. The semiconductor device of claim 15 wherein the one or more peanut-shaped connection structures form a hole array structure.

22. The semiconductor device of claim 15 wherein the semiconductor device comprises a memory device.

23. The semiconductor device of claim 15 wherein the semiconductor device comprises a static random access memory (SRAM) device.

24. The semiconductor device of claim 15 wherein the semiconductor device comprises a logic device.

25. A connection structure for connecting a first layer overlying a second layer of a semiconductor device, comprising:
   a connection layer disposed between the first and second layers and, the connection layer on and in contact with the first and second layers, wherein the connection layer includes:
   a peanut-shaped opening comprising a narrow area and two wide areas, wherein the narrow area is between the two wide areas; and
   a conductive plug of the semiconductor device for filling at least partially the peanut-shaped opening, wherein the conductive plug conforms to the peanut shaped opening to have an upper peanut shaped surface that contacts the first layer and an opposing lower peanut shaped surface that contacts the second layer.

26. The connection structure of claim 25 wherein the connection structure is for connecting an interconnect layer and a substrate.

27. The connection structure of claim 25 wherein the connection structure is for connecting two different metal layers.

28. The connection structure of claim 25 wherein the connection structure is for connecting interconnect layers.

29. A method for connecting layers of a semiconductor device, comprising:
 providing a first layer of the semiconductor device;
 providing a second layer of the semiconductor device, the first layer overlying the second layer; and
 providing a connection layer between and on and in contact with the first layer and the second layer, the connection layer includes at least one opening having a conductive plug at least partially filling the opening, wherein the conductive plug is formed in the opening of the semiconductor device, wherein the opening includes a narrow area between two wide areas, wherein the conductive plug has an upper surface bounded by the narrow and two wide areas that contacts the first layer and an opposing lower surface bounded by the narrow and two wide areas that contacts the second layer; wherein a length of the opening in the direction parallel to the first layer extends through the narrow area and wide areas of the opening.

30. The method of claim 29 wherein the first layer comprises a substrate, and the second layer comprises an interconnect layer.

31. The method of claim 29 wherein each of the first layer and the second layer comprises an interconnect layer.

32. The method of claim 29 wherein each of the first layer and the second layer comprises a metal layer.

33. The method of claim 29, wherein the conductive plug comprises a material selected from following group: TiN, TaN, W, Cu and Cu content.

34. The method of claim 33, wherein the width of the narrow area ranges between about one sixth to about four fifths of the width of each of the two wide areas.

* * * * *